United States Patent
Kvinta et al.

(10) Patent No.: US 7,893,722 B2
(45) Date of Patent: Feb. 22, 2011

(54) CLOCK CONTROL OF STATE STORAGE CIRCUITRY

(75) Inventors: Stephen Andrew Kvinta, Cedar Park, TX (US); Marlin Wayne Frederick, Austin, TX (US); Chih-Wei Huang, Austin, TX (US)

(73) Assignee: ARM Limited, Cambridge (GB)

( * ) Notice: Subject to any disclaimer, the term of this patent is extended or adjusted under 35 U.S.C. 154(b) by 181 days.

(21) Appl. No.: 12/232,187

(22) Filed: Sep. 11, 2008

(65) Prior Publication Data

US 2010/0060321 A1    Mar. 11, 2010

(51) Int. Cl.
H03K 19/096    (2006.01)
H03K 3/00    (2006.01)
G01R 31/28    (2006.01)

(52) U.S. Cl. .................... 326/96; 327/218; 714/732
(58) Field of Classification Search ........... 326/93, 326/96, 56
See application file for complete search history.

(56) References Cited

U.S. PATENT DOCUMENTS

| | | | |
|---|---|---|---|
| 5,999,030 A * | 12/1999 | Inoue | 327/202 |
| 7,292,672 B2 * | 11/2007 | Isono | 377/64 |
| 2005/0268191 A1 * | 12/2005 | Shin | 714/726 |
| 2007/0103217 A1 * | 5/2007 | Frederick et al. | 327/218 |
| 2008/0115025 A1 * | 5/2008 | Frederick | 714/732 |
| 2009/0015321 A1 * | 1/2009 | Hamdan et al. | 327/544 |
| 2010/0083062 A1 * | 4/2010 | Huang et al. | 714/718 |

* cited by examiner

Primary Examiner—Vibol Tan
Assistant Examiner—Dylan White
(74) Attorney, Agent, or Firm—Nixon & Vanderhye P.C.

(57) ABSTRACT

State storage circuitry is described comprising a master-slave latch having tristate inverter circuitry 2 at its functional input and tristate scan signal insertion circuitry 12 for inserting scan data. The tristate scan signal insertion circuitry 12 is controlled by a first clock signal nclk and a second clock signal bclk. The tristate inverter circuitry 2 is controlled by a third clock signal nfclk and a fourth clock signal flck. The clock generating circuitry holds the third and fourth clock signals at fixed values which tristate the tristate inverter circuitry 2 when in scan mode. This moves scan control logic out of the function path comprising the tristate inverter circuitry into the clock control circuitry.

18 Claims, 6 Drawing Sheets

Non-Inverting Four Clock Mux-D Scan Flop

Time A

Time B

Time C

Time D

Time E

Inverting Four Clock Mux-D Scan Flop

CLOCK CONTROL OF STATE STORAGE CIRCUITRY

BACKGROUND OF THE INVENTION

1. Field of the Invention

This invention relates to the field of state storage circuitry, including different types of latches, flip-flops, registers etc. More particularly, this invention relates to the control of such state storage circuitry with clock signals.

2. Description of the Prior Art

FIG. 1 of the accompanying drawings illustrates a known inverting mux-D scan flop built using CMOS circuitry. The functional data signal d is applied to a P-type gate and a N-type gate within a stack comprising three P-type gates and three N-type gates. This stack also includes two gates switched by the scan enable signal se and the complement of the scan enable signal nse. The final two transistors within the stack are switched by the complement nclk of the input clock clk to the clock tree illustrated as well as a buffered clock bclk generated from clock nclk. When scan enable is not asserted, the gates controlled by the scan enable signal se and the complement of the scan enable signal nse are conductive. Accordingly, the input data signal will pass through the six gate stack and be inverted when the clock nclk is high and the clock bclk is low. The time between the data signal being asserted and the rising edge of the input clock signal clk is the set up time of the flop. The signal which passes through the six transistor stack is captured in a master stage of the flop. During this capture the tristate invertor 2 is non-conductive. Once the clock nclk and the clock bclk transition, the data within the master stage will be held as the six transistor stack will be tristated. At this point, the tristate invertor 2 becomes conductive and the data captured within the master stage is transferred to the slave stage. When the input clock is returned to its original condition, the tristate invertor 2 will become non-conductive and the data within the slave stage will be held. When the data first enters the slave stage, it starts to drive the output q and this forms the end point of the clock to output delay.

Also shown in FIG. 1 are two P-type transistors with gates respectively controlled by the scan input signal si and the complement of the scan enable signal nse and two N-type transistors with gates respectively controlled by the scan input signal si and the scan enable signal se. These gates are used to insert scan data into the master stage of the flop. When scan enable is asserted, the data path for signal d is tristate and one of the sets of two transistors performing the scan data insertion will either pull the master stage up or pull the master stage down depending upon the scan input signal si providing the clock bclk is low and the clock nclk is high.

FIG. 2 illustrates a non-inverting mux-D scan flop of a design similar to that of FIG. 1. In particular the six gate stack and the scan inserting gates operate in the same manner.

A number of problems arise with the state storage circuitry illustrated in FIGS. 1 and 2. A first problem is that the functional data path into the latch is via a stack of six gates, namely three P-type gates and three N-type gates. This slows propagation of a data signal into the master stage. Furthermore, the same clocks that define the data set up time (i.e. the time at which the six gate stack will be tristate) are also used to control the clock to output delay time. Thus, whilst it may be desired to delay the time at which the six gate stack becomes tristated to permit a greater time for the master stage to properly capture the data value, this has a consequence of also increasing the clock to output delay.

SUMMARY OF THE INVENTION

Viewed from one aspect the present invention provides state storage circuitry comprising:

tristate scan signal insertion circuitry responsive to a scan input signal, a first clock signal, a second clock signal and a scan enable signal, to drive a storage signal in dependence upon said scan input signal at a scan capture time controlled by said first clock signal and said second clock signal when said scan enable signal is asserted;

tristate logic circuitry responsive to one or more functional input signals, a third clock signal and a fourth clock signal to drive said storage signal dependent upon said one or more functional input signals at a functional capture time controlled by said third clock signal and said fourth clock signal;

signal storing circuitry responsive to said storage signal to set a value of a stored signal in dependence upon a value of said storage signal, said value of said stored signal being held by said signal storing circuitry; and clock signal generating circuitry providing said first clock signal, said second clock signal, said third clock signal and said fourth clock signal, said third clock signal and said fourth clock signal being held at fixed values that control said tristate logic circuitry to a state in which said storage signal is not driven by said tristate logic circuitry when said scan enable signal is asserted.

The invention realises that the functional path input through the tristate logic circuitry can be tristated as needed during scan by holding its clock signals at appropriate values. This has the result that the tristate logic circuitry need no longer include gates switched by the scan enable signal. This makes the tristate logic circuitry faster to operate and increases the maximum speed of the state storage circuitry. In practice the technique can be considered as moving control of the tristating of the tristate logic circuitry from the tristate logic circuitry itself into the clock signal generating circuitry. This increases the complexity of the clock signal generating circuitry, but the advantage in the increased speed of the tristate logic circuitry more than compensates.

It will be appreciated that the tristate logic circuitry could have a variety of different forms. It may be responsive to multiple data input signals, e.g. it could provide logic functions such as AND, OR, etc. However, a simple, fast and effective use of the present technique is when the tristate logic circuitry is tristate inverter circuitry responsive to the third clock signal and the fourth clock signal to drive the storage signal to an inverted value of a functional input signal. State storage circuitry having this functionality is common within integrated circuits and improvements in the speed of such elements are strongly advantageous.

In some embodiments the tristate inverter circuitry can comprise a stack of two P-type inverter circuitry transistors and two N-type inverter circuitry transistors switched by the functional input signal and the third and fourth clock signals. This is a compact and efficient arrangement.

The tristate scan signal insertion circuitry may comprise a stack of three P-type insertion circuitry transistors and three N-type insertion circuitry transistors. These can be driven by the first and second clock signals, the scan enable signal and its complement as well as the scan input signal. Such a six gate stack may be relatively slow, but this is not a significant disadvantage in the scan path since the scan path will typically be many times slower than the functional path.

The signal storage circuitry can have a variety of different forms. The present technique is well suited to embodiments in which the signal storage circuitry is a master-slave latch.

Within such a master-slave latch there will be provided a master stage receiving the storage signal from the tristate logic circuitry and the tristate scan signal inserting circuitry. A tristate invertor is used to pass this storage signal through to a slave stage which holds a stored signal in dependence thereupon.

The tristate invertor within the master-slave latch may be switched by the first clock signal and the second clock signal. The first clock signal and the second clock signal are no longer being used to tristate the tristate logic circuitry and accordingly the clock to output delay can be reduced whilst not at the same time adversely directly impacting the setup time as the tristate logic circuitry is controlled by its own clocks.

The feedback within the master stage can also be switched by the first clock signal and the second clock signal so as to promote capture of the signal being inserted into the master slave.

The clock generating circuitry can have a wide variety of different forms. In one form the clock generating circuitry comprises a chain of signal inverter circuits with the different clock signals being tapped from different positions along the chain. The chain of inverter circuits may include within it clock disabling circuitry upstream of tap positions for the third clock signal and the fourth clock signal with this clock disabling circuitry being responsive to assertion of the scan enable signal so as to disable clock signal propagation along the chain thereby holding the third clock signal and the fourth clock signal at the fixed values required to tristate the tristate logic circuitry.

It will be appreciated that the clock disabling circuitry could have a variety of different forms with one suitable form being a two input NOR gate having as its inputs the second clock signal and the scan enable signal with scan enable asserted corresponding to a true signal value being input to the NOR gate.

In other embodiments the clock disabling circuitry may be a two input NAND gate having as inputs the second clock signal and a scan enable signal with scan enable asserted corresponding to a false signal value being input to the NAND gate.

Whilst the relationship between the different clock signals could vary and will typically include some time lag, it is advantageously simple when the second clock signal is a complement of the first clock signal and the fourth clock signal is a complement of the third clock signal.

Viewed from another aspect the present invention provides a method of controlling state storage circuitry having a functional data path to a state storing circuit controlled by one or more functional clock signals and a scan data path to said state storing circuit controlled by one or more scan clock signals, said method comprising the steps of:

in response to scan enable signal having a value corresponding to said scan mode, holding said one or more functional clock signals at values that block said functional data path and generating said one or more scan clock signals;

in response to scan enable signal having a value corresponding to said functional mode, blocking said scan data path with one or more gates switched by said scan enable signal and generating said one or more functional clock signals.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
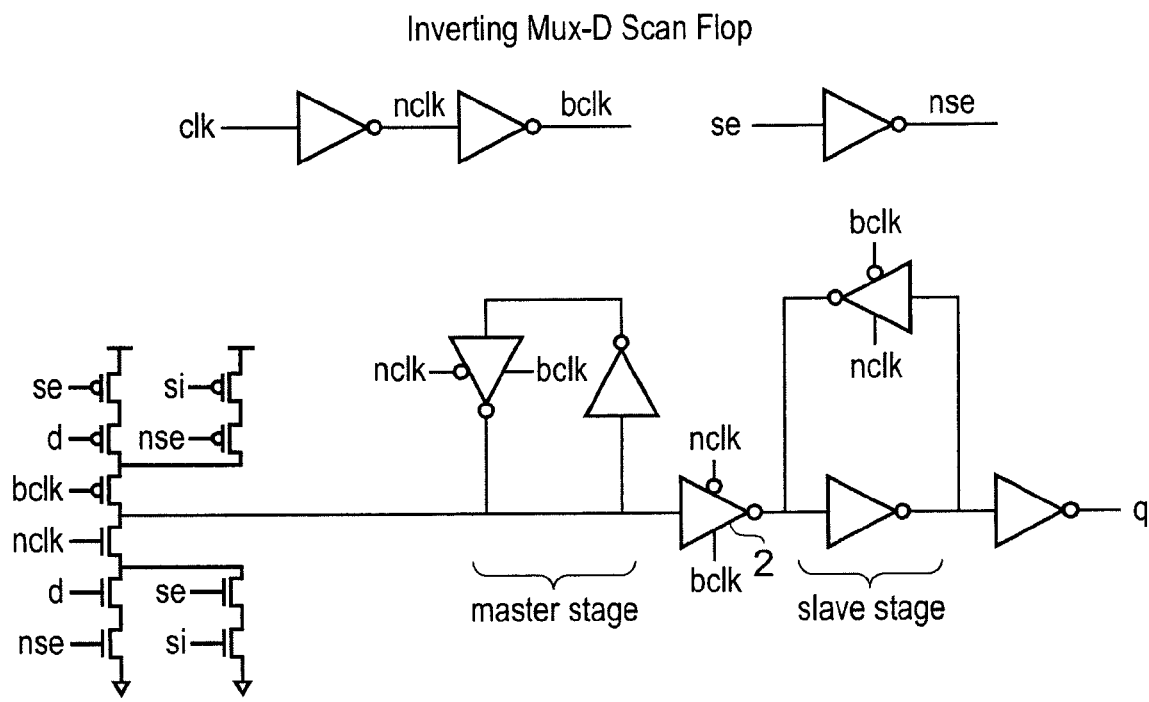
FIGS. 1 and 2 schematically illustrates known mux-D scan flops.
Figure 2:
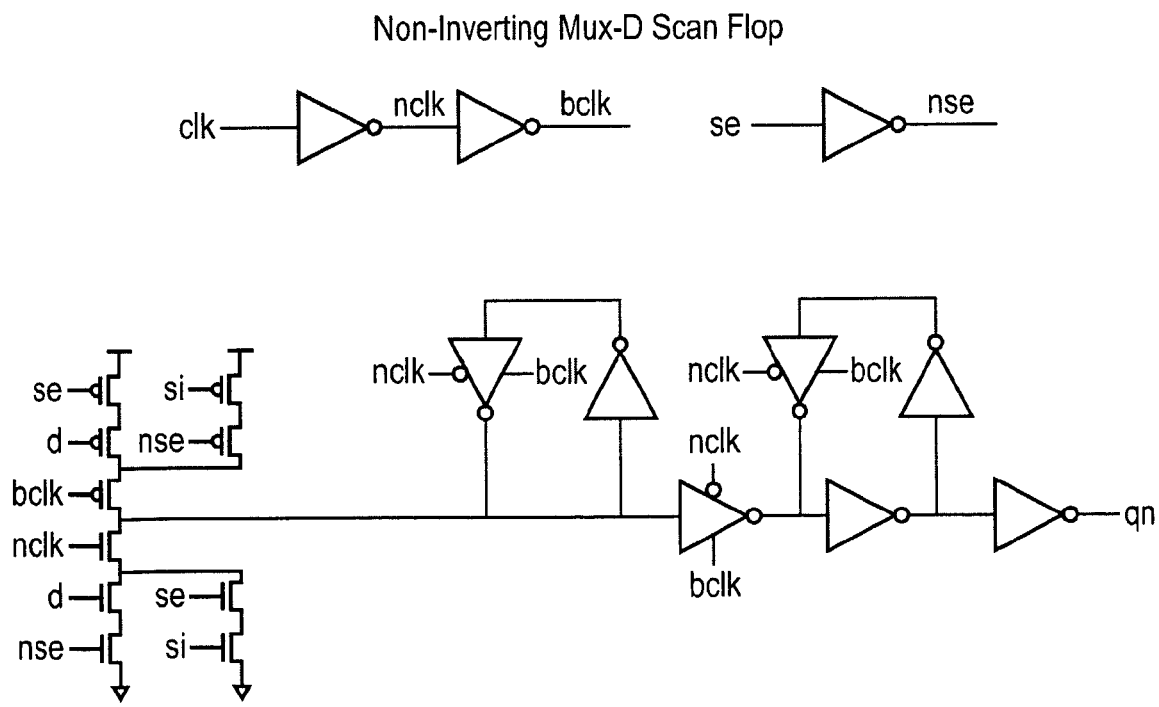
Figure 3:
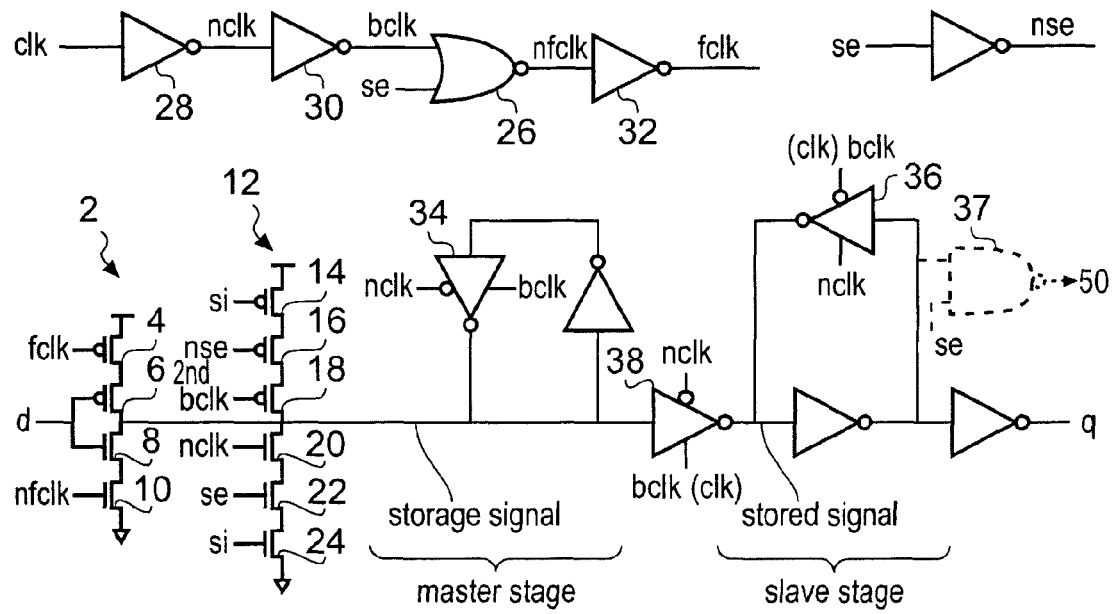
FIG. 3 schematically illustrates a non-inverting four clock mux-D scan flop according to one embodiment of the present technique.

FIG. 3 shows tristate logic circuitry in the form of tristate inverter circuitry 2 comprising two P-type gates 4, 6 and two N-type gates 8, 10. The output from this tristate inverting circuitry 2 drives the storage signal which is applied to the master stage of the state storage circuitry. Tristate scan signal insertion circuitry 12 comprises three P-type gates 14, 16, 18 and three N-type gates 20, 22, 24. The tristate scan signal insertion circuitry 12 drives the storage signal during scan mode.

In functional mode the scan enable signal se is not asserted (low) and accordingly gates 22 and 16 are switched off and the tristate scan signal insertion circuitry 12 is tristated and not driving the storage signal. During the scan mode the tristate scan signal insertion circuitry 12 does drive the storage signal and in this case the clock signals to the gates 4 and 10 respectively comprising the fourth clock signal fclk and the third clock signal nfclk are held at fixed values (high and low respectively) which tristate the tristate inverter circuitry 2.

Shown in the upper portion of FIG. 3 is a clock tree for generating the clock signals for controlling the state storage circuitry. An input clock signal clk is inverted to form a first clock signal nclk. The first clock signal nclk is inverted again to form the second clock signal bclk. bclk forms one input to a two input NOR gate with the other input being the scan enable signal (true when scan enable is asserted) with the NOR gate generating the third clock signal nfclk. A further inverter generates the fourth clock signal fclk from the third clock signal nfclk. The two input NOR gate serves as clock disabling circuitry 26 within an inverter chain comprising inverters 28, 30 and 32.

Returning to the state storage circuitry, this is in the form of a master-slave latch including a master stage and a slave stage. Each of these stages includes feedback circuitry including respective tristate invertors 34, 36 which are switched by the first and second clock signals. A tristate invertor 38 is disposed between the master stage and the slave stage and is also switched by the first and second clock signals.

A scan output signal so can be provided in some embodiments using the two input NAND gate 37 shown in dashed for in FIG. 3. On input of this NAND gate 37 is the scan enable signal se and the other input is the stored signal with the slave stage.

Figure 4:
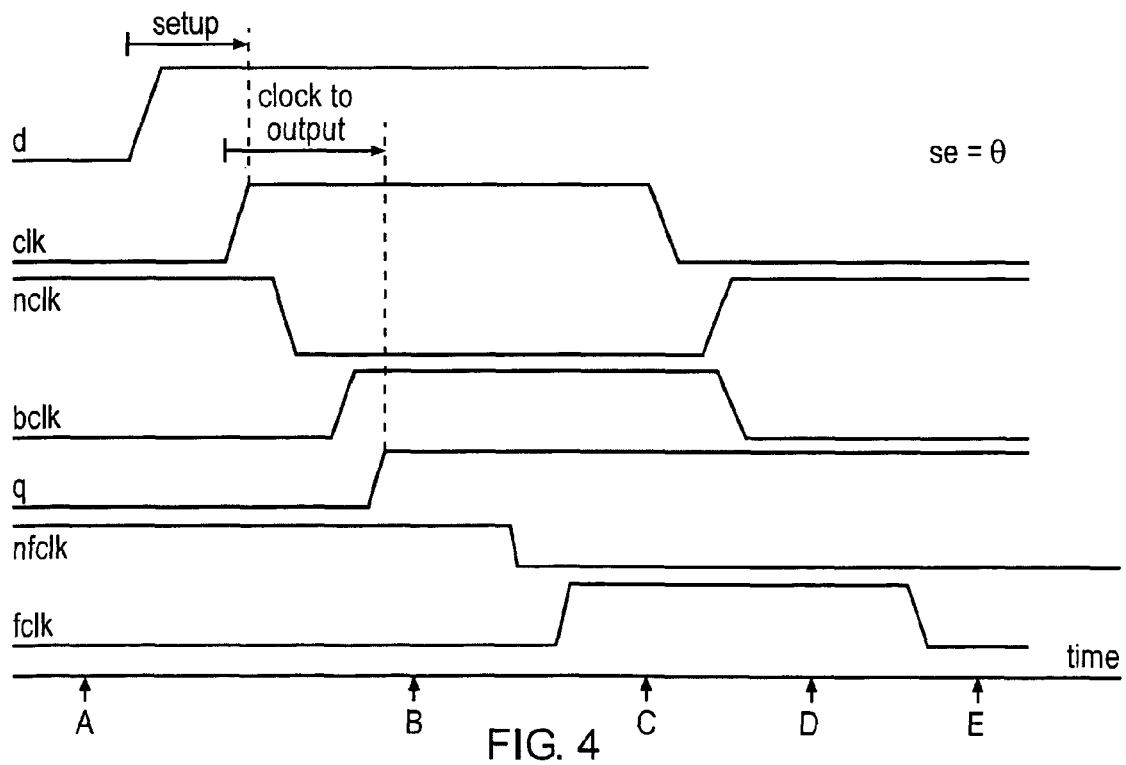
FIG. 4 is a signal timing diagram illustrating the relationship between the four clock signals used to control the state storage circuitry of FIG. 3 during functional mode.

FIG. 4 is a timing diagram illustrating the relative timing of the clock signals generated in response to transitions within the input clock signals clk when using the clock tree illustrated in FIG. 3. In this figure the functional mode is active and the scan enable signal se is set low. This renders to clock disabling circuitry 26 as not blocking clock propagation. As will be seen from FIG. 4, a transition within the input clock clk propagates along the inverter chain 28, 30, 32 with inversions at each stage and with a larger delay when propagating through the two input NOR gate (clock disabling circuitry 26) compared with when merely passing through one of the inverters 28, 30, 32. Various times A, B, C, D and E are illustrated. The behaviour of the state storage circuitry of FIG. 3 at each of these different times is illustrated in the following discussion of FIGS. 5 to 9.

Figure 5:
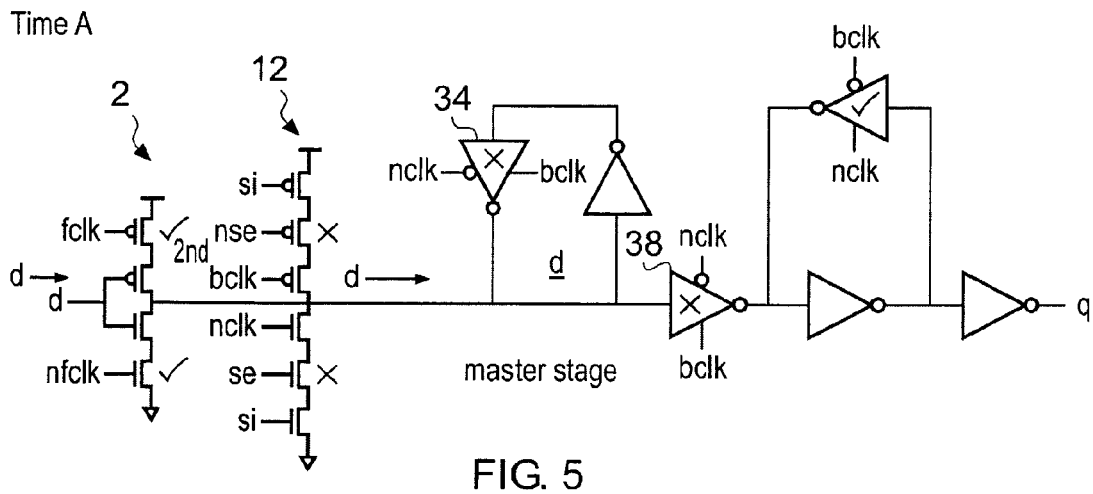
FIGS. 5 to 9 illustrate the operation of the state storage circuitry of FIG. 3 during functional mode.

In FIG. 5 the tristate inverter circuitry 2 is open and the data signal propagates into the master stage. The tristate scan signal insertion circuitry 12 is tristated during all of FIGS. 5 to 9 as the scan enable signal se is not asserted. At time A, tristate invertor 38 is not open and tristate invertor 34 is not open permitting the input signal d to be more readily captured within the master stage.

Figure 6:
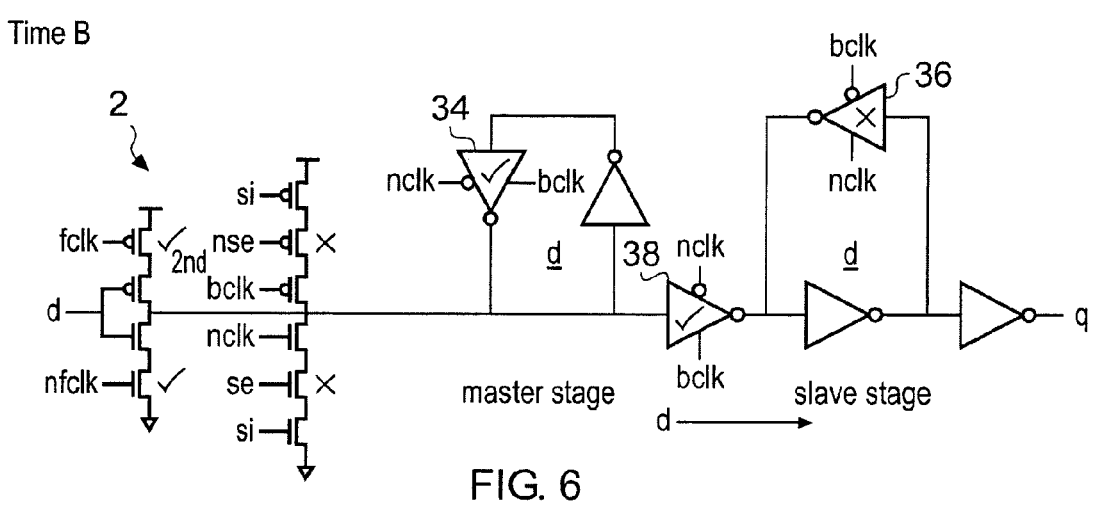

In FIG. 6 at time B the tristate inverter circuitry 2 remains open but now the first and second clocks nclk and bclk have transitioned. The transition in the first and second clocks renders tristate invertors 38 and 34 open. This turns on the feedback within the master stage and also permits the newly captured data value to propagate to the output of the state storage circuitry at node q. The tristate invertor 36 is turned off at this time enabling the newly captured data value d passing through the transmission to be more readily captured within the slave stage.

Figure 7:
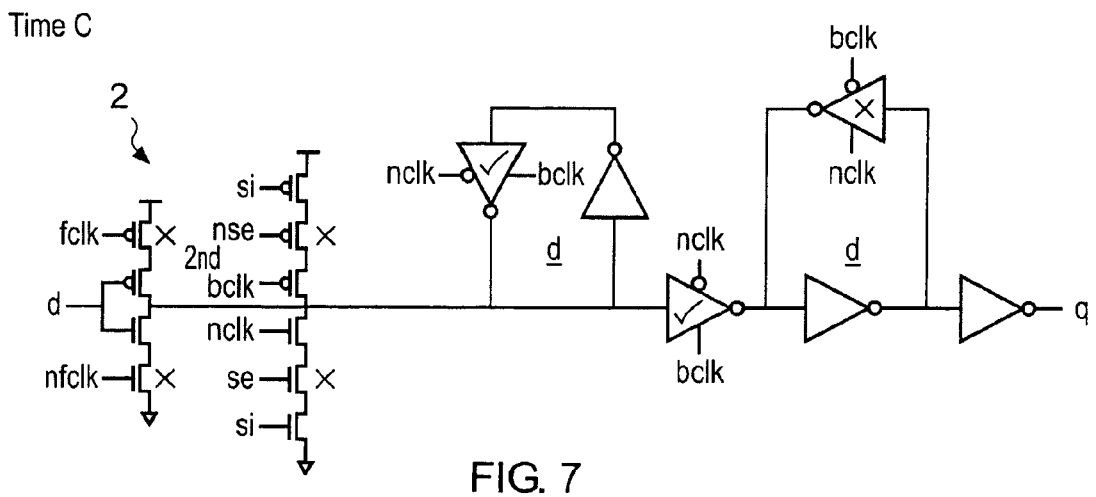

In FIG. 7 at time C the third and fourth clock signals nfclk and fclk transition rendering the tristate inverter circuitry 2 non-transmissive and thereby ending the setup time. After time C, changes in the input signal d supplied to the tristate inverter circuitry 2 will not propagate into the state storage circuitry.

Figure 8:
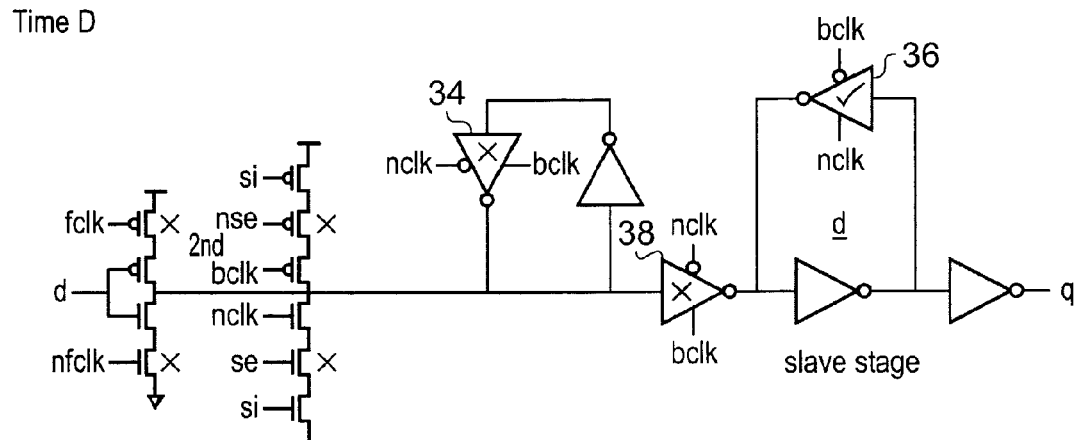

In FIG. 8 at time D, the input clock clk has gone low resulting in the first clock signal nclk and the second clock signal bclk also switching. The first clock signal nclk and the second clock signal bclk serve to switch off the tristate invertors 34 and 38 and switch on the tristate invertor 36. This turns on the feedback within the slave stage thereby securely capturing the data value d.

Figure 9:
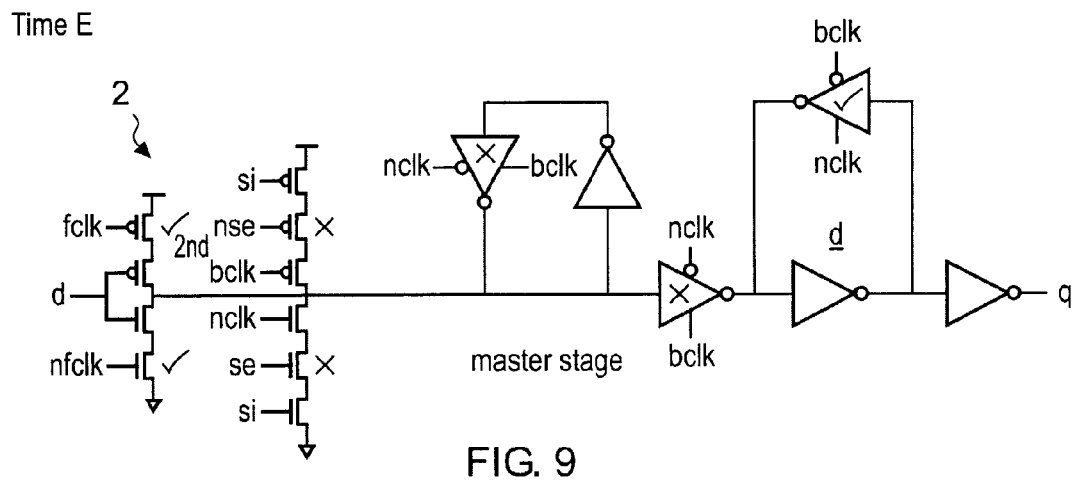

In FIG. 9 at time E, the third clock signal nfclk and the fourth clock signal fclk have also transitioned with the result that tristate inverting circuitry 2 is no longer tristated and input signals can again flow into the master stage.

Figure 10:
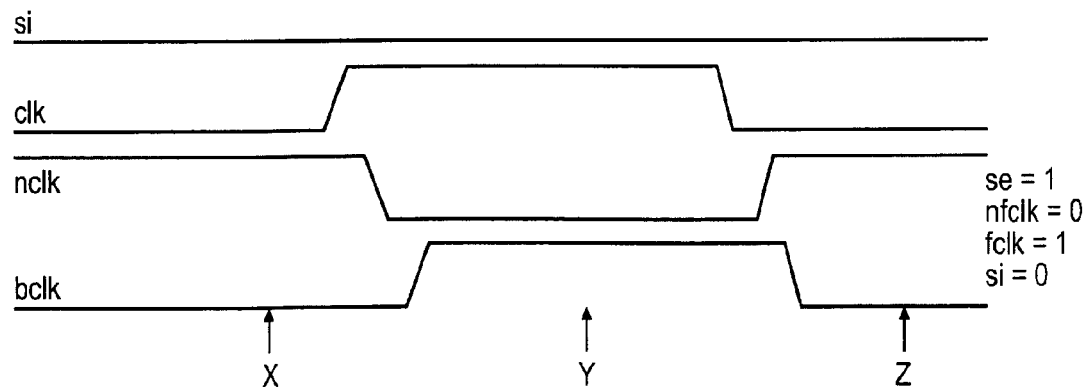
FIG. 10 is a timing diagram illustrating the relationship between the clock signals during scan mode.

FIG. 10 is a signal diagram illustrating the clock signals used in controlling the circuitry of FIG. 3 during scan mode. In scan mode the scan enable signal is asserted high. In response to the scan enable signal se being high, the two input NOR gate within the clock tree, which serves as the clock disabling circuitry 26, holds the third clock signal nfclk low and the fourth clock signal fclk will accordingly be held high. The third and fourth clock signals will not change from these values whilst the scan enable signal remains asserted, i.e. whilst the system is in the scan mode rather than the functional mode.

Figure 11:
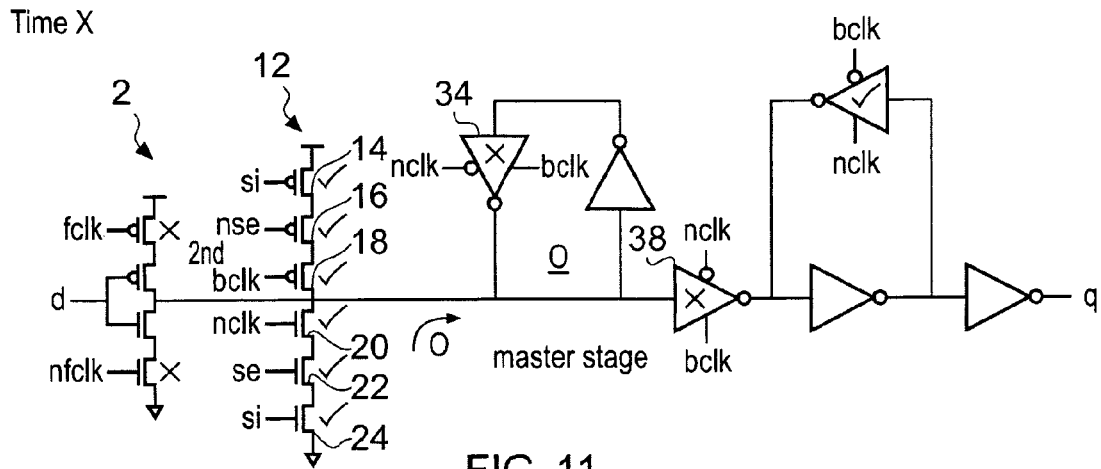
FIGS. 11, 12 and 13 schematically illustrate the operation of the state storage circuitry of FIG. 3 during scan mode.
Figure 12:
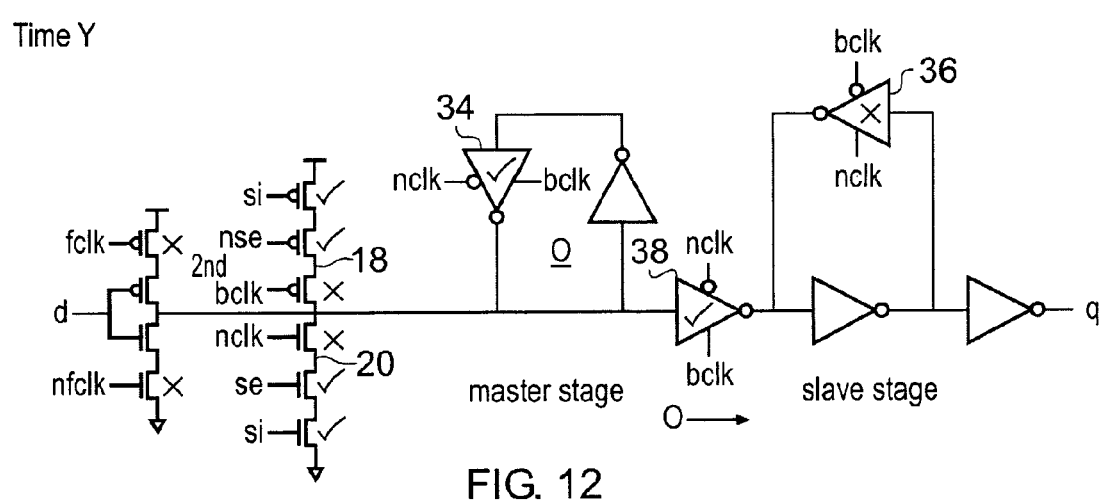
Figure 13:
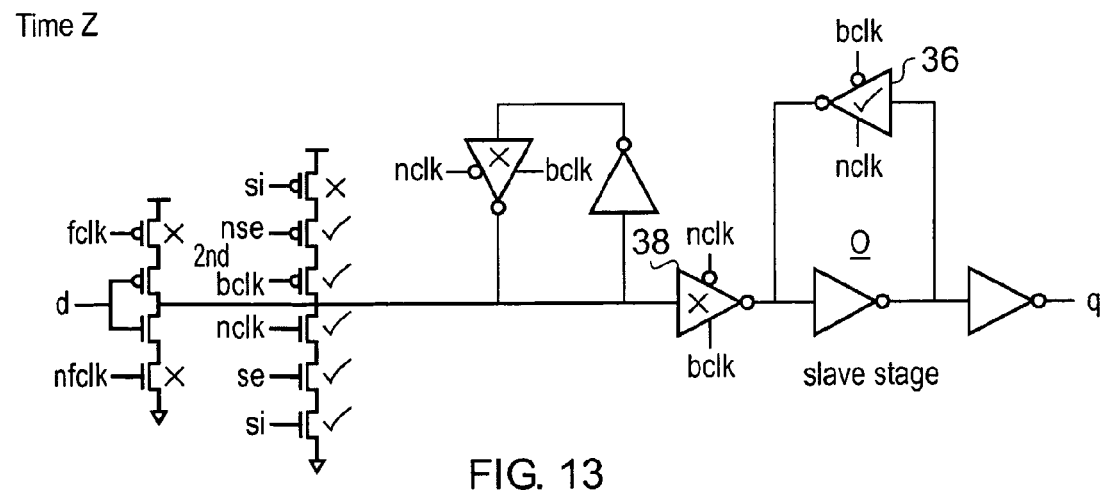

FIG. 10 illustrates three times X, Y and Z at which the operation of the state storage circuitry of FIG. 3 will be illustrated in FIGS. 11, 12 and 13.

In FIG. 11 at time X the tristate inverter circuitry 2 is held tristated by virtue of the static values of the third clock signal nfclk and the fourth clock signal fclk as previously discussed. The scan signal insertion circuitry 12 is no longer tristated by the scan enable signal se. In this example the scan input si signal to be stored into the state storage circuitry is a value "0", which is driven into the master stage via gates 20, 22, 24. It will be appreciated that if the scan signal to be inserted was a "1", then this will be driven into the master stage via gates 14, 16, 18. At time E, the tristate invertor 34 is closed as is the tristate invertor 38. Accordingly, the feedback within the master stage is switched off and this assists capture of the "0" value in the master stage.

In FIG. 12 at time Y, the first clock signal nclk and the second clock signal bclk have transitioned. This turns off gates 18 and 20 as well as opening tristate invertors 34 and 38. tristate invertor 36 is switched off. Accordingly, the captured value of "0" propagates from the master stage into the slave stage via the tristate invertor 38. The capture of the value "0" within the slave stage is assisted by the tristate invertor 36 being switched off thereby switching off the feedback within the slave stage.

In FIG. 13 at time Z, the input clock signal clk has transitioned resulting in a further transition in the first clock signal nclk and the second clock signal bclk. This switches off the transition gate 38 and switches on the tristate invertor 36. Accordingly, the scan value "0" will be securely held within the slave stage and will be output from the output of the state storage circuitry.

Figure 14:
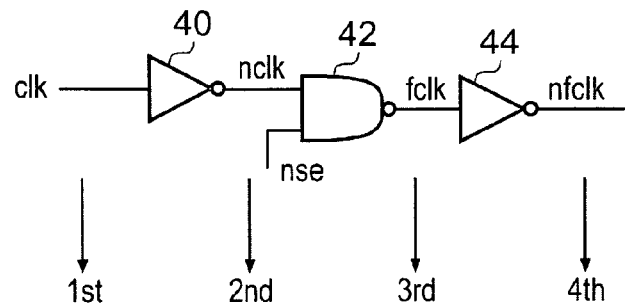
FIG. 14 illustrates alternative clock generation circuitry.

FIG. 14 illustrates an alternative embodiment of clock generating circuitry which may be used. In this case the input clock signal clk serves as the first clock signal. An inverter 40 generates the second clock signal nclk. The second clock signal nclk forms one input to a two input NAND gate 42. The other input to the NAND gate is the complement of the scan enable signal (i.e. the input to the NAND gate is false when scan enable is asserted in scan mode). The output from the NAND gate 42 is the third clock signal fclk which is also supplied to an inverter 44 which generates the fourth clock signal nfclk.

Figure 15:
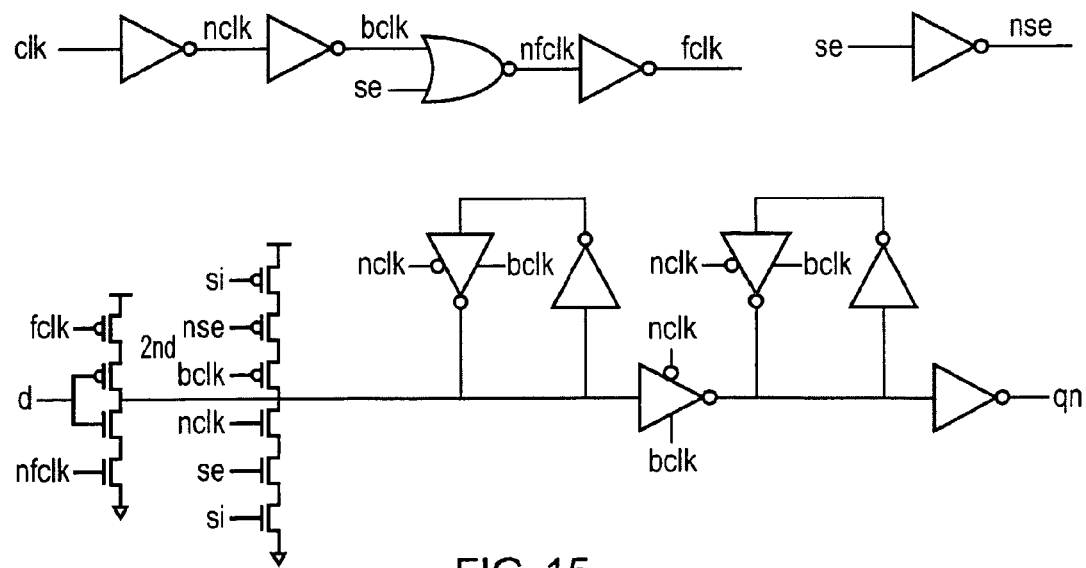
FIG. 15 schematically illustrates an inverting four clock mux-D scan flop according to another embodiment of the present technique.

FIG. 15 schematically illustrates an inverting four clock mux-d scan flop operating in accordance with the same principle as the circuit of FIG. 3.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. State storage circuitry comprising:
   tristate scan signal insertion circuitry responsive to a scan input signal, a first clock signal, a second clock signal and a scan enable signal, said tristate scan signal insertion circuitry comprising transistors controlled by said scan enable signal and a complement of said scan enable signal to control said tristate scan signal insertion circuitry to drive a storage signal in dependence upon said scan input signal at a scan capture time controlled by said first clock signal and said second clock signal when said scan enable signal is asserted;
   tristate logic circuitry responsive to one or more functional input signals, a third clock signal and a fourth clock signal to drive said storage signal dependent upon said one or more functional input signals at a functional capture time controlled by said third clock signal and said fourth clock signal;

signal storing circuitry responsive to said storage signal to set a value of a stored signal in dependence upon a value of said storage signal, said value of said stored signal being held by said signal storing circuitry; and clock signal generating circuitry providing said first clock signal, said second clock signal, said third clock signal and said fourth clock signal, said third clock signal and said fourth clock signal being held at fixed values that control said tristate logic circuitry to a state in which said storage signal is not driven by said tristate logic circuitry when said scan enable signal is asserted.

2. State storage circuitry as claimed in claim 1, wherein said tristate logic circuitry is tristate inverter circuitry responsive to said third clock signal and said fourth clock signal to drive said storage signal to an inverted value of a functional input signal.

3. State storage circuitry as claimed in claim 2, wherein said tristate inverter circuitry comprises a stack of two P-type inverter circuitry transistors and two N-type inverter circuitry transistors disposed between a source power supply and a ground power supply with said storage signal being driven at a connection between said two P-type inverter circuitry transistors and said two N-type inverter circuitry transistors, a first of said N-type inverter circuitry transistors and a first of said P-type inverter circuitry transistors being switched by respective ones of said third clock signal and said fourth clock signal.

4. State storage circuitry as claimed in claim 3, wherein a second of said P-type inverter circuitry transistors and a second of said N-type inverter circuitry transistors are switched by said one functional signal.

5. State storage circuitry as claimed in claim 1, wherein said tristate scan signal insertion circuitry comprises a stack of three P-type insertion circuitry transistors and three N-type insertion circuitry transistors disposed between a source power supply and a ground power supply with said storage signal being driven at a connection between said three P-type insertion circuitry transistors and said three N-type insertion circuitry transistors, a first of said N-type insertion circuitry transistors and a first of said P-type insertion circuitry transistors being switched by respective ones of said first clock signal and said second clock signal.

6. State storage circuitry as claimed in claim 5, wherein a second of said P-type insertion circuitry transistors and a second of said N-type insertion circuitry transistors are switched by said scan enable signal and said complement of said scan enable signal.

7. State storage circuitry as claimed in claim 6, wherein a third of said P-type insertion circuitry transistors and a third of said N-type insertion circuitry transistors are switched by said scan input signal.

8. State storage circuitry as claimed in claim 1, wherein said signal storage circuitry comprises a master-slave latch.

9. State storage circuitry as claimed in claim 8, wherein said master-slave latch comprises a master stage receiving said storage signal and passing said storage signal through a tristate invertor to a slave stage holding said stored signal.

10. State storage circuitry as claimed in claim 9, wherein said tristate invertor is switched by said first clock signal and said second clock signal.

11. State storage circuitry as claimed in claim 9, wherein said master stage comprises a feedback circuit including a tristate invertor switched by said first clock signal and said second clock signal.

12. State storage circuitry as claimed in claim 1, wherein said clock signal generating circuitry comprises a chain of signal inverter circuits with said first clock signal, said second clock signal, said third clock signal and said fourth clock signal being tapped from different tap positions along said chain.

13. State storage circuitry comprising:

tristate scan signal insertion circuitry responsive to a scan input signal, a first clock signal, a second clock signal and a scan enable signal, to drive a storage signal in dependence upon said scan input signal at a scan capture time controlled by said first clock signal and said second clock signal when said scan enable signal is asserted;

tristate logic circuitry responsive to one or more functional input signals, a third clock signal and a fourth clock signal to drive said storage signal dependent upon said one or more functional input signals at a functional capture time controlled by said third clock signal and said fourth clock signal;

signal storing circuitry responsive to said storage signal to set a value of a stored signal in dependence upon a value of said storage signal, said value of said stored signal being held by said signal storing circuitry; and clock signal generating circuitry providing said first clock signal, said second clock signal, said third clock signal and said fourth clock signal, said third clock signal and said fourth clock signal being held at fixed values that control said tristate logic circuitry to a state in which said storage signal is not driven by said tristate logic circuitry when said scan enable signal is asserted, wherein said clock signal generating circuitry comprises a chain of signal inverter circuits with said first clock signal, said second clock signal, said third clock signal and said fourth clock signal being tapped from different tap positions along said chain, wherein said chain includes clock disabling circuitry upstream of tap positions for said third clock signal and said fourth clock signal and responsive to assertion of said scan enable signal to disable clock signal propagation along said chain past said clock disabling circuitry and holding said third clock signal and said fourth clock signal at said fixed values.

14. State storage circuitry as claimed in claim 13, wherein said clock disabling circuitry is a two input NOR gate having as inputs said second clock signal and said scan enable signal with scan enable asserted corresponding a true signal value being input to said NOR gate.

15. State storage circuitry as claimed in claim 13, wherein said clock disabling circuitry is a two input NAND gate having as inputs said second clock signal and said scan enable signal with scan enable asserted corresponding a false signal value being input to said NAND gate.

16. State storage circuitry as claimed in claim 1, wherein said second clock signal is a complement of said first clock signal.

17. State storage circuitry as claimed in claim 1, wherein said fourth clock signal is a complement of said third clock signal.

18. A method of controlling state storage circuitry having a functional data path to a state storing circuit controlled by one or more functional clock signals and a scan data path to said state storing circuit controlled by one or more scan clock signals, said method comprising the steps of:

in response to scan enable signal having a value corresponding to said scan mode, holding said one or more functional clock signals at values that block said functional data path and generating said one or more scan clock signals;

in response to scan enable signal having a value corresponding to said functional mode, blocking said scan data path with one or more gates switched by said scan enable signal and generating said one or more functional clock signals, wherein said one or more scan clock signals comprise a first clock signal and a second clock signal and said one or more functional clock signals comprise a third clock signal and a fourth clock signal, wherein said storage circuitry includes:

tristate scan signal insertion circuitry responsive to a scan input signal, said first clock signal, said second clock signal and a scan enable signal, said tristate scan signal insertion circuitry comprising transistors controlled by said scan enable signal and a complement of said scan enable signal to control said tristate scan signal insertion circuitry to drive a storage signal in dependence upon said scan input signal at a scan capture time controlled by said first clock signal and said second clock signal when said scan enable signal is asserted;

tristate logic circuitry responsive to one or more functional input signals, said third clock signal and said fourth clock signal to drive said storage signal dependent upon said one or more functional input signals at a functional capture time controlled by said third clock signal and said fourth clock signal;

signal storing circuitry responsive to said storage signal to set a value of a stored signal in dependent upon a value of said storage signal, said value of said stored signal being held by said signal storing circuitry; and clock signal generating circuitry providing said first clock signal, said second clock signal, said third clock signal and said fourth clock signal, said third clock signal and said fourth clock signal being held at fixed values that control said tristate logic circuitry to a state in which said storage signal is not driven by said tristate logic circuitry when said scan enable signal is asserted.

* * * * *